United States Patent [19]

Schwarz et al.

[11] Patent Number: 5,233,871
[45] Date of Patent: Aug. 10, 1993

[54] HYBRID ACCELEROMETER ASSEMBLY

[75] Inventors: Dwight L. Schwarz, Kokomo; William M. Maki, Fort Wayne; Glen R. Puterbaugh; John A. Hearn, both of Kokomo, all of Ind.

[73] Assignee: Delco Electronics Corporation, Kokomo, Ind.

[21] Appl. No.: 786,614

[22] Filed: Nov. 1, 1991

[51] Int. Cl.$^5$ .............................................. G01P 1/02
[52] U.S. Cl. ................................... 73/493; 73/517 R
[58] Field of Search ................. 73/493, 517 R, 516 R, 73/431; 280/735

[56] References Cited

U.S. PATENT DOCUMENTS

| | | | |
|---|---|---|---|
| 4,164,263 | 8/1979 | Heintz et al. | 73/517 R |
| 4,295,117 | 10/1981 | Lake et al. | 338/4 |
| 4,700,973 | 10/1987 | Gademann et al. | 73/493 |
| 4,756,193 | 7/1988 | Luettgen | 73/756 |
| 4,805,456 | 2/1989 | Howe et al. | 73/517 AV |
| 4,850,227 | 7/1989 | Luettgen et al. | 73/708 |
| 4,851,080 | 7/1989 | Howe et al. | 156/647 |
| 4,901,570 | 2/1990 | Chang et al. | 73/517 AV |

Primary Examiner—John E. Chapman
Attorney, Agent, or Firm—Robert J. Wallace

[57] ABSTRACT

A microaccelerometer package is provided for use in on-board automotive safety control and navigational systems. The microaccelerometer package is constructed so as to minimize the influence of extraneous mechanical stress and vibrational resonance on the micromachined accelerometer. The microaccelerometer package includes a rigid housing in which there is a cavity for receiving the micromachined accelerometer unit and the signal-processing circuitry. The lower surface of the cavity is interrupted by a recess projecting below the plane of the lower surface. The micromachined accelerometer unit is secured within the recess so as to be below the plane of the lower surface. The signal-processing circuitry is supported by a substrate which is secured to the lower surface of the cavity. One edge of the substrate, on which are disposed a number of wire bond sites, partially projects over the accelerometer unit within the recess, but no further than a corresponding number of wire bond sites on the micromachined accelerometer unit. Electrically interconnecting the wire bond sites of the signal-processing circuitry and the micromachined accelerometer unit are a corresponding number of electrical conductors.

6 Claims, 2 Drawing Sheets

HYBRID ACCELEROMETER ASSEMBLY

This invention generally relates to sensors of the accelerometer type. More specifically, this invention relates to microaccelerometer packaging having improved stress isolation and ruggedness such that the microaccelerometer assembly is suitable for use in an automotive environment.

BACKGROUND OF THE INVENTION

An accelerometer is one of the primary sensors used in on-board automotive safety control systems and navigational systems, particularly crash sensing systems. Examples of such automotive applications include anti-lock braking systems, active suspension systems, supplemental inflatable restraint systems such as air bags, and seat belt lock-up systems. An accelerometer is a device which measures acceleration, or more accurately, accelerometers measure the force that is exerted by a body as the result of a change in the velocity of the body. A moving body possesses inertia which tends to resist the change in velocity. It is this resistance to any change in velocity that is the source of the force which is exerted by the moving body. This force is directly proportional to the acceleration component in the direction of movement when the moving body is accelerated.

In one conceptual form of a conventional accelerometer, a mass is suspended between two spring members which are coaxially attached on opposite sides of the mass. The mass is maintained in a neutral position so long as the system is at rest or is in motion at a constant velocity. When the mass-spring support system undergoes a change in velocity in the direction of the springs' axis, i.e. an acceleration or deceleration parallel the spring axis, the spring mounted mass will resist the movement because of its inertia. This resistance to the change in velocity will force one of the springs to be in tension while the other spring is compressed. Accordingly, the force acting on each spring is equal but opposite in magnitude to the force acting upon the other.

In a micromachine accelerometer employing iezoresistive microbridges, acceleration in the plane perpendicular to a plane through the proof mass and microbridges can be detected. It causes a compressive or tensile load on portions of the oppositely disposed piezoresistive microbridges supporting the proof mass, depending on which direction it comes from in that plane. It is the accelerating force on the support system for the proof mass and the proof mass inertia which generates compressive or tensile loads on the piezoresistive microbridges. In turn, the resulting compressive or tensile loads change electrical resistance of piezoresistors in the microbridges. This change in electrical resistance can be sensed to determine the magnitude of the acceleration component perpendicular to the plane of the common axis shared by the pair of piezoresistive microbridges. This type of piezoresistive microbridge accelerometer is attractive for precision measurements.

Such precision products could be quite useful in automotive applications. However, they must be adequately packaged to protect the micromachined accelerometer from an automobile's harsh environment. The accelerometer not only should be isolated from the mechanical stresses associated with mounting the package, but also must be protected from the extraneous road and vehicle vibrations during use. Moreover, the package must isolate the accelerometer from the harsh automotive environment, such as salt, grease, dust and moisture. In addition, it should be easy to assemble, to improve quality and durability and to reduce cost. Still further, the proof mass, microbridges and their supporting system have to be packaged, and/or the package itself supported, in a manner wherein the microaccelerometer will only be sensitive to those particular external forces which it is intended to detect. For example, if it is to detect acceleration or deceleration of the vehicle itself, one would not ordinarily want it to also detect jarring of the vehicle due to a bump or chuck hole in a road surface. In addition, it would be desirable if the packaging were small and compact while also providing an inert protective atmosphere for the micromachined accelerometer. Lastly, it would also be advantageous if such a packaging means facilitated early testing of the device while also being amenable to high volume, low cost automotive production techniques.

Therefore, it would be advantageous to provide microaccelerometer packaging which is constructed so as to isolate the micromachined accelerometer from mechanical stresses associated with mounting the device and extraneous vibrations, while also providing a testable assembly which is small, compact and amenable to automotive production techniques.

SUMMARY OF THE INVENTION

It is an object of the present invention to provide a microaccelerometer package which is suitable for use in automotive applications and manufacturable by automotive production techniques.

It is another object of this invention that the microaccelerometer package be capable of isolating the micromachined accelerometer from extraneous stresses, while also being small, light-weight, and amenable to mass production techniques.

It is a further object of this invention that such a microaccelerometer package employ a housing in which both the micromachined accelerometer and the signal-processing circuitry necessary to condition the output signal of the micromachined accelerometer can be enclosed.

It is still a further object of this invention that the micromachined accelerometer and its signal-processing circuitry be positioned within the housing so as to minimize the length of the electrical connectors needed to interconnect the micromachined accelerometer with the circuitry.

It is yet another object of this invention that the signal-processing circuitry remain accessible for final trimming and tuning procedures prior to sealing the package closed.

Lastly, it is a further object of this invention that the microaccelerometer packaging process utilize automated wire bond technology for electrically connecting the micromachined accelerometer with the signal-processing circuitry.

In accordance with a preferred embodiment of this invention, these and other objects and advantages are accomplished as follows.

A microaccelerometer package is provided which is suitably rugged for use in on-board automotive safety control and navigational systems. The microaccelerometer package is constructed so as to minimize the influence of extraneous road and vehicle vibrations on the micromachined accelerometer. As a result, a more reliable signal output is provided by the micromachined accelerometer for indicating an automobile's acceleration or deceleration. The microaccelerometer package includes a rigid housing in which there is a cavity for receiving the micromachined accelerometer unit and the signal-processing circuitry. The bottom of the cavity is defined by a lower surface. The lower surface is generally planar, being interrupted by a recess which projects below the plane of the lower surface.

In the preferred embodiment, the micromachined accelerometer unit is secured within the recess in the lower surface of the housing cavity so as to be below the plane of the lower surface. The micromachined accelerometer unit comprises a sensing element contained within a hermetically-sealed canister. Disposed along one edge of the canister are a number of wire bond sites from which the output signal generated by the sensing element can be transmitted through the canister walls to the signal-processing circuit. The electrical leads extend upwardly from the canister toward the cavity.

The signal-processing circuitry is supported by a substrate which is secured to the lower surface of the cavity. One edge of the substrate partially projects over the recess and the accelerometer unit therein, but no further than the wire bond sites on the micromachined accelerometer unit. The signal-processing circuitry has a number of wire bond sites corresponding to the wire bond sites of the micromachined accelerometer. These wire bond sites are located adjacent the projecting edge of the substrate such that the wire bond sites of the signal-processing circuitry are proximately located to the wire bond sites of the accelerometer unit, both of which are near the plane defined by the lower surface of the cavity. Proximity of the corresponding wire bond sites facilitates automated procedures for attaching the electrical conductors to the wire bond sites.

In addition, electrical contacts extend through a wall of the housing through which the conditioned signal from the signal-processing circuitry is transmitted for subsequent use with the associated automotive system, such as a supplemental inflatable restraint system, an anti-lock braking system, an active suspension system, or a seat belt lock-up system. The signal-processing circuitry and micromachined accelerometer unit are then preferably coated with a passivation compound, and the housing sealed from the automotive environment with a suitable lid.

A particularly advantageous feature of this invention is that both the micromachined accelerometer unit and its signal-processing circuitry are enclosed within the housing in a manner which minimizes space requirements. The micromachined accelerometer unit and the signal-processing circuitry are also positioned and secured relative to each other so as to reduce the possible relative movement therebetween. As such, vibration of each component is inhibited as well as the effects of extraneous vibrations on the micromachined accelerometer unit, therefore the accelerometer unit is still capable of properly sensing the automobile acceleration or deceleration. Such advantages are particularly desirable for the hostile automotive environment for which the micromachined accelerometer is intended.

Another distinct advantage of the present invention is that the electrical connectors between the micromachined accelerometer unit and the signal-processing circuitry need only extend over the projecting edge of the signal-processing circuitry's substrate in order to reach the corresponding wire bond sites of the micromachined accelerometer unit. Both groups of wire bond sites are located near the plane defined by the lower surface of the cavity, and therefore little vertical projection of the electrical conductors is required. As noted above, minimizing the length of the electrical conductors facilitates automated procedures for attaching the electrical conductors to the wire bond sites.

A further advantage is that the signal-processing circuitry remains accessible after being mounted within the cavity until the passivation treatment is applied. Where thick film circuitry is utilized, such an advantage allows for final trimming of the resistors in the circuit for the purpose of correcting any signal output errors resulting from manufacturing and processing tolerances of the individual elements of both the circuit and the micromachined accelerometer. In addition, the packaging means provides a small compact assembly which is amenable to automotive production techniques.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawings wherein.

DETAILED DESCRIPTION OF THE PREFERRED EMBODIMENTS

Figure 1:
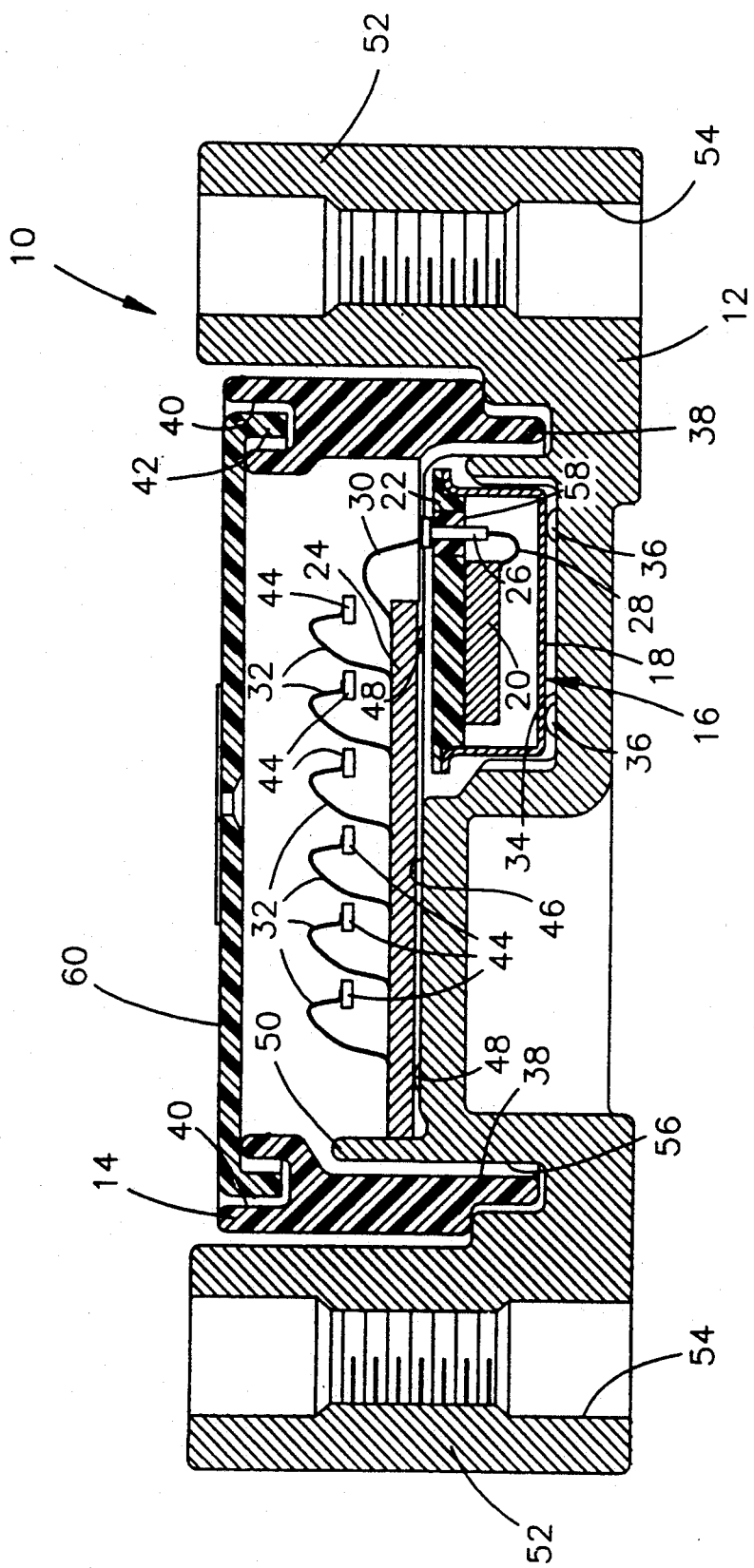
FIG. 1 is a cross sectional view of the construction and arrangement of a micromachined accelerometer package in accordance with a preferred embodiment of the present invention.
Figure 2:
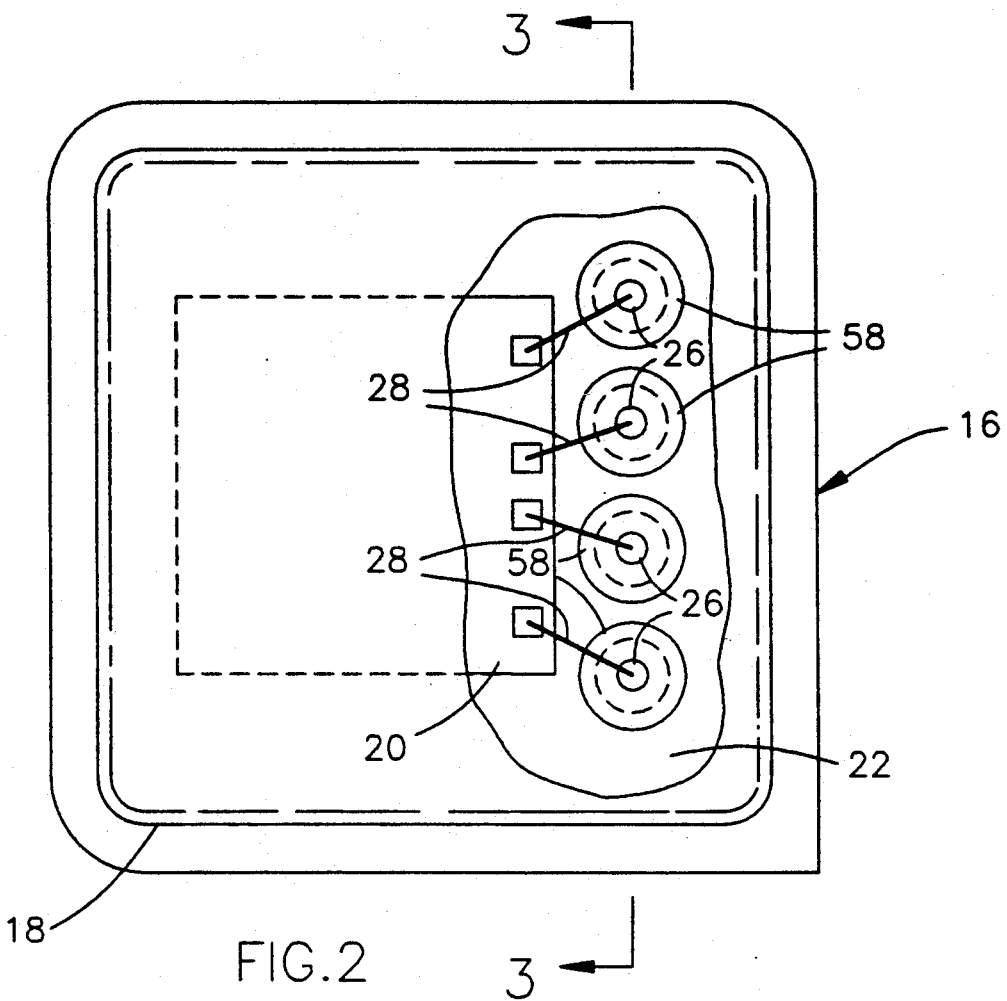
FIG. 2 is a cross sectional top view of the micromachined accelerometer unit of FIG. 1.

With reference to FIG. 1, a microaccelerometer package 10 is shown for housing a microaccelerometer unit 16 and its associated hybrid thick film circuitry (not shown) which is formed on an alumina substrate 24. The microaccelerometer unit 16 includes a micromachined accelerometer sensing element 20. The microaccelerometer unit 16 is electrically connected to the hybrid thick film circuitry, comprised of a thick film circuit and at least one integrated circuit, by one or more electrically conducting leads 30. The leads 30 allow the micromachined accelerometer's input power and output signal to be transmitted from and to the hybrid thick film circuitry for signal conditioning and processing.

The thick film circuit is deposited onto the alumina substrate 24 using conventional means such as silk screening techniques, although other techniques could also be used. The conditioned output signal is thereafter transmitted from the hybrid thick film circuitry through electrical leads 32 to six terminal blades 44 which extend through a wall of the microaccelerometer package 10 for subsequent connection in the associated vehicle control system.

The microaccelerometer package 10 includes a backplate 12 having a pair of oppositely disposed mounting structures 52. The backplate 12 is preferably a die cast aluminum which provides rigidity to the microaccelerometer package 10. This rigidity reduces the stress transferred to the microaccelerometer unit 16, such stress being generated by securely attaching the mounting structures 52 against "uneven" mounting structures within the automobile. Testing has indicated that the die cast aluminum backplate 12 is also able to remain rigid and unaffected by vibrational noise up to and beyond 3000 Hertz at levels that would otherwise input a false vibration signal to the microaccelerometer unit 16. Each mounting structure 52 has a threaded bore 54 therethrough for mounting the microaccelerometer package 10 to a suitable structure within the automobile. Between the mounting structures 52 lies a planar surface 46 for supporting and securing the substrate 24 within the microaccelerometer package 10. Surrounding the entire planar surface 46 so as to lie between the planar surface 46 and each mounting structure 52 is a trough 56 for a purpose to be described later.

Disposed at one end of the planar surface 46 and adjacent the trough 56 is a recess 34. The recess 34 is centrally located on one edge of the planar surface 46 such that the planar surface 46 is substantially U-shaped. The recess 34 projects below the planar surface 46 by a distance sufficient to receive the microaccelerometer unit 16 comprising a canister 18 and cover 22 which house a micromachined accelerometer sensing element 20. The canister 18 is preferably formed from an appropriate steel, but other suitable materials such as a nickel may be used. The cover 22 is formed from a low expansion KOVAR material but could be foreseeably formed from a steel or other material in the future. Both the canister 18 and cover 22 are electroless nickel plated but could be plated with other appropriate metals suitable for bonding such as gold, silver or copper. The canister 18 and cover 22 are hermetically attached to each other, thus providing a rigid and closed structure for the micromachined accelerometer sensing element 20, the advantages of which are discussed more fully later. The recess 34 is generally square-shaped as viewed from above, as is the canister 18 for housing the micromachined accelerometer sensing element 20 so as to closely fit within the recess 34. The canister 18 is secured to the floor of the recess 34 by a suitable bonding agent which is applied evenly onto the surface of the floor of the recess 34 for uniform adhesion, and is preferably a primerless silicone adhesive material such as Dow Corning QX-6265. Such a silicone adhesive is more resilient than an epoxy or other rigid mounting material, such that adhesive-transmitted mechanical stresses are greatly reduced. In addition, this layer of resilient adhesive also prevents transfer of any stresses which may arise during the mounting of the package 10 with the mounting structures 52. Spacing means 36 are employed to result in the uniform spacing of adhesive so as to prevent tilting of the micromachined sensing element 20 from uneven distribution of the adhesive or to prevent the adhesive joint between backplate 12 and canister 18 from becoming too thin and nonresilient.

Figure 3:
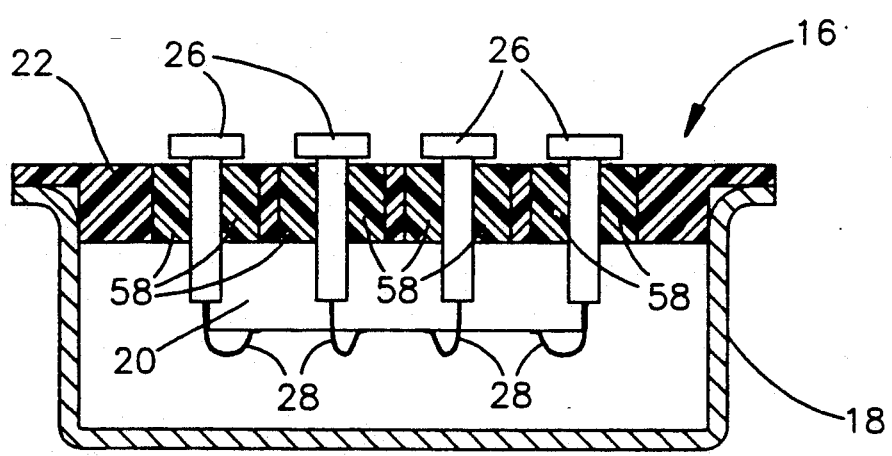
FIG. 3 is a cross-sectional side view of the micromachined accelerometer unit of FIG. 2.

As best seen in FIG. 3, the micromachined accelerometer sensing element 20 is bonded to the cover 22 with a silicone die attach adhesive, such as Dow Corning HIPEC SDA6501 compound. This compound is a high purity silicone with the additional advantage of avoiding ionic contamination of the sensitive electronic circuitry. The micromachined accelerometer sensing element 20 is electrically connected with a number of aluminum conductors 28, approximately 0.002 inches in diameter, to a like number of pins 26 which extend through the cover 22. Gold wire connectors of about 0.001 to about 0.002 inches diameter could be substituted for the aluminum conductors 28 if a suitable plating was first deposited onto the pins 26. The pins 26 are also bonded to the cover 22 with an appropriate glass, such as Corning Glass #7052 which is suitable for a metal-to-glass seal and common in the hermetic sealing industry, indicated by reference numeral 58.

Each pin 26 serves as a wire bond site and has a corresponding wire bond site provided on the micromachined accelerometer sensing element 20. The aluminum conductors 28 are formed using known wire bonding techniques. The wire bonding process attaches one end of the aluminum conductor 28 to either the micromachined accelerometer sensing element 20 or the pin 26, and then dispenses the aluminum conductor 28 as it travels to the other wire bond site where it secures the opposite end of the aluminum conductor 28.

The packaging process for the micromachined accelerometer unit 16 encompasses hermetically sealing the microaccelerator unit 16 using a conventional welding process. In being a hermetically sealed microaccelerometer unit 16, the micromachined accelerometer sensing element 20 is protectively housed, and is dry passivated with no requirement for itself to be a hermetically sealed device.

The alumina substrate 24 on which the hybrid thick film integrated circuitry is deposited (as shown best in FIG. 1) is positioned on the planar surface 46 and permanently secured thereto at several locations with the preferred silicone adhesive material, such as Dow Corning QX-6265. Preferably the silicone adhesive is applied evenly onto the surface 46 for uniform adhesion. Spacing means 48 are again preferably employed to result in the uniform spacing of adhesive under the alumina substrate 24 so as to prevent tilting of the substrate 24 from uneven distribution of the adhesive. The alumina substrate 24 is positioned so as to abut one or more vertical projections 50 arising from the planar surface 46 adjacent the trough 56, so that the alumina substrate 24 projects partially across the recess 34 such that approximately half of the microaccelerometer unit 16 remains exposed, including that portion which includes the pins 26.

As noted before, the planar surface 46 is substantially U-shaped, such that the alumina substrate 24 is vertically supported along its entire length, being supported by the planar surface 46 only along its lateral edges on either side of the recess 34. The substrate 24 does not contact the microaccelerometer unit 16, but is suspended above the microaccelerometer unit 16 by the planar surface 46 so as to isolate, from vibrational and mechanical stresses, the microaccelerometer sensing element 20. As shown, the alumina substrate 24 is bonded to the planar surface 46 such that the hybrid thick film circuitry is firmly secured to the planar surface 46 of the aluminum backplate 12, even with the presence of the recess 34.

Disposed along the edge of the substrate 24 which projects over the recess 34 are a number of wire bond sites (not shown) which correspond to the number of pins 26 for the microaccelerometer unit 16. The pins 26 serve as wire bond sites for the microaccelerometer unit 16. Formed between the wire bond sites of the alumina substrate 24 and the microaccelerometer unit 16 are the corresponding number of electrical leads 30. The leads 30 are preferably aluminum and approximately 0.008 to 0.010 inches in diameter. As described previously under the discussion of the aluminum conductors 28 between the micromachined accelerometer sensing element 20 and the pins 26, the leads 30 are formed using known wire bonding techniques, although other suitable methods could also be employed. The wire bonding process is further facilitated by the proximity of the wire bond sites of the alumina substrate 24 and the pins 26.

A housing 14 is secured to the aluminum backplate 12 by inserting a lower edge 38 into the trough 56 formed in the aluminum backplate 12, thereby forming a cavity within the microaccelerometer package 10. Before the housing 14 is attached to the backplate 12, a suitable bonding agent, such as Dow Corning Q3-6611, is deposited in suitable quantity into the groove 56 so as to provide complete adhesive contact along and between the entire length of edge 38 and groove 56. The housing 14 is preferably formed from a rigid light-weight material, such as Celanex 3300D, a 30% glass filled polyester. The six terminal blades 44 noted above extend through one wall of the housing 14 by which the conditioned micromachined accelerometer signal can be transmitted to the associated vehicle control system. Six corresponding electrical leads 32 interconnect the alumina substrate 24 with the terminal blades 44. Similar to the leads 30 between the microaccelerometer unit 16 and the alumina substrate 24, the leads 32 are each approximately 0.008 to 0.010 inches in diameter and are formed using known wire bonding techniques. The terminal blades 44 are preferably formed from a copper alloy for good electrical conductivity, but are tin plated outside of the housing 14 for good solderability to the external electronic vehicle control system, while being preferably aluminum clad inside the housing 14 for reliable wire bonding with the leads 32.

Along the upper periphery of the housing 14 is a groove 40. The groove 40 receives a lip 42 which extends downwardly from a cover 60 which encloses the cavity formed by the housing 14 and backplate 12. Before the cover 60 is attached to the housing 14, a high temperature vulcanizing silicone passivation gel (not shown), such as Dow Corning Q3-6635, is deposited into the cavity to protect both the substrate 24 and the microaccelerometer unit 16. Such a protective gel is very compliant for purposes of minimizing stresses due to thermal expansion and contraction of the gel in relation to the internal components of the microaccelerometer package 10. An air gap of approximately 1/16 of an inch is left between the cover 60 and the silicone passivation gel to provide for thermal expansion and the like. In addition, before the cover 60 is attached to the housing 14, preferably a suitable bonding agent, such as the Dow Corning Q3-6611, is disposed in suitable quantity into groove 40 so as to provide complete adhesive contact along and between the entire length of lip 42 and groove 40.

A significant advantage of the present invention as described above is that both the microaccelerometer unit 16 and the hybrid thick film circuitry are enclosed within the microaccelerometer package 10 in a manner which minimizes the package's weight and space requirements. The microaccelerometer unit 16 and the substrate 24 supporting the hybrid thick film circuitry are also positioned and secured relative to each other so as to diminish the effects of relative movement therebetween. As such, vibration of either component is inhibited from being transmitted as an extraneous vibration to the micromachined accelerometer sensing element 20, which significantly reduces the mechanical and vibrational stresses associated with mounting and use of the package assembly. Such advantages are particularly desirable for the hostile automotive environment for which the micromachined accelerometer sensing element 20 is intended.

Another distinct advantage of the present invention is that the leads 30 between the microaccelerometer unit 16 and the substrate 24 need only extend over the projecting edge of the substrate 24 in order to reach the pins 26 which serve as the wire bond sites for the microaccelerometer unit 16. Both pairs of wire bond sites are located near the plane defined by the planar surface 46 of the cavity, and therefore little vertical projection of the leads 30 is required. The short distance between the wire bonding sites also facilitates automated wire bonding procedure employed for attaching the leads 30 to the wire bond sites, and minimizes any electromagnetic interference concerns.

A further advantage is that the hybrid thick film circuitry remains accessible after being mounted within the cavity until the passivation treatment is applied. Such an advantage allows for final trimming of the resistors in the circuitry for the purpose of correcting any signal output errors resulting from manufacturing and processing of the individual elements of both the circuitry and the micromachined accelerometer sensing element 20 due to tolerances and thermal or mechanically induced stresses.

The above structural characteristics minimizes the ability of extraneous vibrations and mechanical stresses to develop and become amplified in the vicinity of the micromachined accelerometer sensing element 20. As a result, the micromachined accelerometer sensing element 20 responds almost exclusively to the vehicle dynamics associated with acceleration and deceleration.

Therefore, while our invention has been described in terms of a preferred embodiment, it is apparent that other forms of the device could be adopted by one skilled in the art. By example, it is clear that these teachings could be used with modified or alternative materials, or with modified processing parameters. It is therefore readily observable by those skilled in the art that there are other parameters which can achieve vibrational and mechanical stress isolation, including the specific processes used, the thicknesses of the different materials used, and the specific geometry of the housing 14 and the backplate 12. Accordingly, the scope of our invention is to be limited only by the following claims.

The embodiments of this invention in which an exclusive property or privilege is claimed are defined as follows:

1. An accelerometer assembly comprising:
   a housing having a cavity with a lower surface defining a plane, said housing having a recess extending below said plane of said lower surface;
   an accelerometer sensing device disposed in said recess, said accelerometer sensing device having a plurality of wire bond sites adjacent said plane defined by said lower surface, said accelerometer sensing device producing an output signal;
   circuitry for transmitting said output signal, said circuitry being disposed on said lower surface of said cavity so as to extend over a portion of said accelerometer sensing device disposed in said recess, said circuitry having a plurality of wire bond sites adjacent said plane defined by said lower surface and proximate to said wire bond sites of said accelerometer sensing device; and
   a plurality of electrical conductors for electrically connecting said wire bond sites of said accelerometer sensing device with said circuitry.

2. An accelerometer assembly as recited in claim 1 wherein said circuitry comprises a hybrid thick film circuitry.

3. An accelerometer assembly as recited in claim 1 wherein said circuitry is bonded to said lower surface and said accelerometer sensing device is bonded within said recess.

4. An accelerometer assembly as recited in claim 1 wherein said housing further comprises:
 a backplate forming said lower surface and said recess; and
 a plastic enclosure secured to said backplate, said plastic enclosure defining said cavity.

5. An accelerometer assembly as recited in claim 1 further comprising a plurality of electrical contacts extending through said housing, said electrical contacts being electrically connected to said circuitry for further transmitting said output signal.

6. An accelerometer assembly comprising:
 an aluminum backplate having a surface defining a plane, said surface having a recess extending downwardly therefrom;
 a plastic enclosure secured to said aluminum backplate, said plastic enclosure and said aluminum backplate defining a cavity, said surface of said aluminum backplate comprising a lower surface of said cavity;
 an accelerometer sensing device bonded within said recess so as to be disposed below said plane, said accelerometer sensing device having a plurality of wire bond sites adjacent said plane defined by said surface, said accelerometer sensing device producing an output signal;
 a thick film circuit for transmitting said output signal, said thick film circuit being bonded to said lower surface of said cavity so as to extend over a portion of said accelerometer sensing device disposed in said recess, said thick film circuit having a plurality of wire bond sites adjacent said plane defined by said surface and proximate to said wire bond sites of said accelerometer sensing device;
 a plurality of electrical conductors for electrically connecting said wire bond sites of said accelerometer sensing device with said thick film circuit; and
 a plurality of electrical contacts extending through said housing, said electrical contacts being electrically connected to said thick film circuit for further transmitting said output signal.

* * * * *